(12) United States Patent
Lu et al.

(10) Patent No.: US 12,374,582 B2
(45) Date of Patent: Jul. 29, 2025

(54) METHOD FOR MAKING SILICON EPITAXY OF A FDSOI DEVICE

(71) Applicant: Shanghai Huali Integrated Circuit Corporation, Shanghai (CN)

(72) Inventors: Lian Lu, Shanghai (CN); Quanbo Li, Shanghai (CN); Jun Huang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 482 days.

(21) Appl. No.: 17/951,756

(22) Filed: Sep. 23, 2022

(65) Prior Publication Data
US 2023/0130629 A1 Apr. 27, 2023

(30) Foreign Application Priority Data
Oct. 25, 2021 (CN) .......................... 202111238450.0

(51) Int. Cl.
*H01L 21/762* (2006.01)
*H01L 21/768* (2006.01)

(52) U.S. Cl.
CPC .. *H01L 21/76256* (2013.01); *H01L 21/76831* (2013.01)

(58) Field of Classification Search
CPC ......... H01L 21/76256; H01L 21/76831; H01L 21/7624
See application file for complete search history.

(56) References Cited

U.S. PATENT DOCUMENTS 5,371,036 A * 12/1994 Lur .......................... H01L 21/32
257/E21.258
9,153,645 B2 * 10/2015 Li ..................... H01L 21/02647

* cited by examiner

*Primary Examiner* — Dale E Page
*Assistant Examiner* — Quovaunda Jefferson
(74) *Attorney, Agent, or Firm* — Banner & Witcoff, Ltd.

(57) ABSTRACT

The present application relates to a method for making silicon epitaxy of a FDSOI device, which includes the following steps: providing a semiconductor structure; sequentially forming a first etch stop layer and an etch reaction layer on a surface of the semiconductor structure; performing an etching operation to the etch reaction layer to form a sidewall structure respectively; filling a second etch stop layer in a space between the sidewall structures at the position of the trench; etching the sidewall structures and the first etch stop layer under the sidewall structures to form a groove structure; removing the second etch stop layer and the remaining first etch stop layer; enabling a silicon substrate at the positions of the trench and the groove structure to epitaxially grow upwards to form epitaxial silicon, the epitaxial silicon being in flush with a top silicon layer.

9 Claims, 4 Drawing Sheets

METHOD FOR MAKING SILICON EPITAXY OF A FDSOI DEVICE

CROSS-REFERENCE TO RELATED APPLICATIONS

This application claims priority to Chinese patent application No. 202111238450.0, filed on Oct. 25, 2021, the disclosure of which is incorporated herein by reference in its entirety.

TECHNICAL FIELD

The present application relates to the technical field of semiconductor integrated circuit manufacturing, in particular to a method for making silicon epitaxy of a Fully Depleted Silicon-On-Insulator (FDSOI) device.

BACKGROUND

Silicon-On-Insulator (SOI) is obtained by introducing a buried layer between top silicon and a silicon substrate, the buried layer forms an insulator, and the top silicon is a semiconductor film located on the insulator, so that the parasitic capacitance can be reduced, the time pulse of the chip can be improved and the chip current leakage can be reduced.

Fully Depleted Silicon-On-Insulator (FDSOI) has become a choice of SOI due to its superior gate control ability and low leakage current.

FIG. 1 illustrates a schematic diagram of a sectional structure of an FDSOI device manufactured through the prior art. Referring to FIG. 1, the partial area of a buried layer 130 is removed by photolithography and etching, thus forming a trench 100 and exposing a silicon substrate 120c. Then, through an epitaxy process, a certain amount of silicon is grown to fill the trench 100, so that forming an epitaxial silicon 140 connected with a top silicon 110.

However, since a bottom of the trench 100 is flat and the top silicon 110 and the silicon substrate 120 will grow at the same time in the epitaxy process, the silicon on the two sides of the trench 100 will grow faster than the bottom, resulting in the growth amount of the silicon on the two sides of the trench 100 is more than the growth amount of the silicon in the middle of the trench 100 after the epitaxy process is completed, so that protrusions illustrated in FIG. 1 are formed on left and right sides of the trench 100, the silicon surface is uneven and it is not conducive to the subsequent process.

BRIEF SUMMARY

The present application provides a method for making silicon epitaxy of a FDSOI device, which can solve the problems that protrusions are formed on the left and right sides of the trench and the silicon surface is uneven in prior art.

The method for making silicon epitaxy of a FDSOI device includes the following steps performed sequentially:

providing a semiconductor structure, a trench being formed in the semiconductor structure, a silicon substrate at the position of the trench being exposed, and the semiconductor structure at a position other than the position of the trench including a silicon substrate, an insulating layer, a top silicon layer and an isolation dielectric layer sequentially stacked from bottom to top;

sequentially forming a first etch stop layer and an etch reaction layer on a surface of the semiconductor structure according to the surface morphology of the semiconductor structure;

performing an etching operation to the etch reaction layer, an etch stop surface of the etching operation being located in the first etch stop layer covering a bottom surface of the trench and in the etch reaction layer covering side surfaces of the trench;

enabling the remaining etch reaction layer on each side surface of the trench to form a sidewall structure respectively;

filling a second etch stop layer in a space between the sidewall structures at the position of the trench;

etching the sidewall structures and the first etch stop layer under the sidewall structures to form a groove structure by using the second etch stop layer as a protective structure, the groove structure being depressed downwards from the bottom surface of the trench;

removing the second etch stop layer and the remaining first etch stop layer;

enabling the silicon substrate at the positions of the trench and the groove structure to epitaxially grow upwards to form epitaxial silicon until the epitaxial silicon is in flush with an upper surface of the top silicon layer.

In some examples, the step of providing a semiconductor structure, a trench being formed in the semiconductor structure, a silicon substrate at the position of the trench being exposed, and the semiconductor structure at a position other than the position of the trench including a silicon substrate, an insulating layer, a top silicon layer and an isolation dielectric layer sequentially stacked from bottom to top includes:

providing a semiconductor substrate, the semiconductor substrate including a silicon substrate, an insulating layer, a top silicon layer and an isolation dielectric layer sequentially stacked from bottom to top;

defining a trench pattern on the isolation dielectric layer through a photolithography process;

etching the semiconductor substrate on the basis of the trench pattern to form a trench so that the silicon substrate at the position of the trench is exposed and the remaining semiconductor substrate forms a semiconductor structure.

In some examples, the step of sequentially forming a first etch stop layer and an etch reaction layer on a surface of the semiconductor structure according to the surface morphology of the semiconductor structure includes:

sequentially forming a first etch stop layer with a thickness ranging from 20 Å to 100 Å and an etch reaction layer with a thickness ranging from 50 Å to 200 Å on a surface of the semiconductor structure according to the surface morphology of the semiconductor structure with the trench.

In some examples, the material of the first etch stop layer is silicon dioxide.

In some examples, the material of the etch reaction layer is polysilicon or silicon nitride.

In some examples, the step of filling a second etch stop layer in a space between the sidewall structures at the position of the trench includes:

coating protective dielectric on the semiconductor structure with the first etch stop layer and the sidewall structures, the protective dielectric being at least filled in the trench with the sidewall structures;

etching the protective dielectric so that upper ends of the sidewall structures are exposed and the remaining protective dielectric is filled in the trench between the sidewall structures to form a second etch stop layer.

In some examples, the material of the protective dielectric is photoresist.

In some examples, in the step of etching the protective dielectric so that upper ends of the sidewall structures are exposed and the remaining protective dielectric is filled in the trench between the sidewall structures to form a second etch stop layer, the thickness of the formed second etch stop layer ranges from 100 Å to 1000 Å.

In some examples, in the step of etching the sidewall structures and the first etch stop layer under the sidewall structures to form a groove structure by using the second etch stop layer as a protective structure, the groove structure being depressed downwards from the bottom surface of the trench, the depth of downward depression of the groove structure from the bottom surface of the trench ranges from 50 Å to 500 Å.

The technical solution of the present application at least has the following advantages: the groove structure formed by adopting the method for making silicon epitaxy of a FDSOI device provided by the present application can offset the silicon overgrown on the two sides of the trench in the subsequent epitaxy process, so that the upper surface of the formed epitaxial silicon is in flush with the upper surface of the top silicon and it is conducive to the subsequent process.

BRIEF DESCRIPTION OF THE DRAWINGS

In order to more clearly describe the technical solutions in the specific embodiments of the present application or the prior art, the following will briefly introduce the drawings needed to be used in the description of the specific embodiments or the prior art. It is obvious that the drawings in the following description are some embodiments of the present application. For those skilled in the art, other drawings can be obtained according to these drawings without contributing any inventive labor.

FIG. 2b illustrates a sectional structure of a device after step S22 on the basis of the structure illustrated in FIG. 2a.

DETAILED DESCRIPTION

The technical solution of the present application will be clearly and completely described below with reference to the drawings. Obviously, the described embodiments are part of the embodiments of the present application, instead of all of them. Based on the embodiments in the present application, all other embodiments obtained by those skilled in the art without contributing any inventive labor still fall within the scope of protection of the present application.

Figure 1:
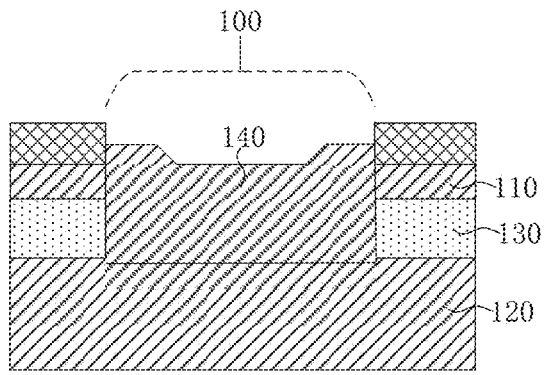
FIG. 1 illustrates a sectional structure of a FDSOI device manufactured through the prior art.
Figure 2:
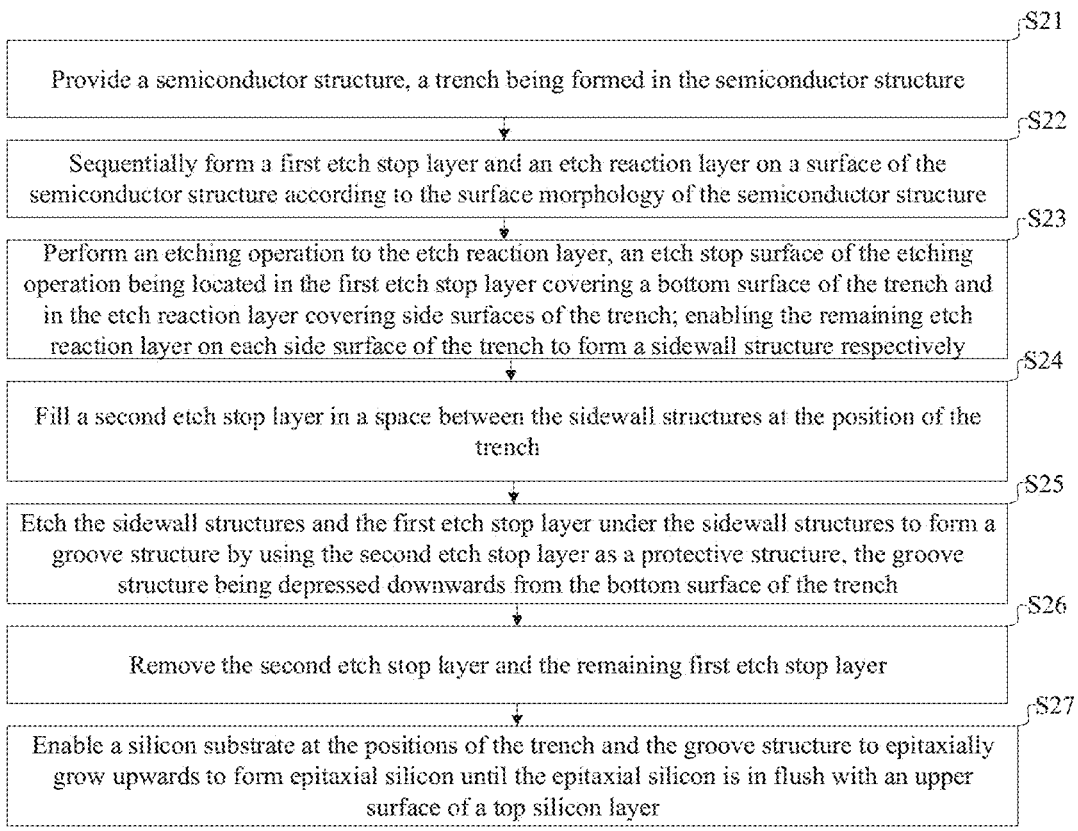
FIG. 2 illustrates a flowchart of a method for making silicon epitaxy of a FDSOI device by an embodiment of the present application.

FIG. 2 illustrates a flowchart of a method for making silicon epitaxy of a FDSOI device by an embodiment of the present application.

Referring to FIG. 2, the method for making silicon epitaxy of a FDSOI device includes the following step S21 to step S27 performed sequentially.

In step S21, a semiconductor structure is provided. A trench is formed in the semiconductor structure. A silicon substrate at the position of the trench is exposed. The semiconductor structure at a position other than the position of the trench includes a silicon substrate, an insulating layer, a top silicon layer and an isolation dielectric layer sequentially stacked from bottom to top.

Figure 2A:
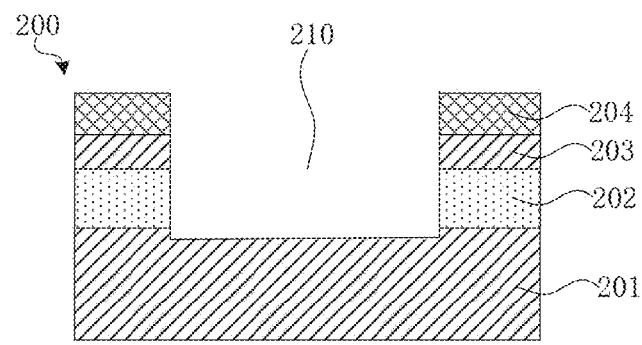
FIG. 2a illustrates a sectional structure of a semiconductor structure with a trench.

Referring to FIG. 2a, it illustrates a sectional structure of a semiconductor structure with a trench.

The semiconductor structure 200 with the trench 210 includes a silicon substrate 201, an insulating layer 202, a top silicon layer 203 and an isolation dielectric layer 204 sequentially stacked from bottom to top. The trench 210 extends downwards from an upper surface of the isolation dielectric layer 204, so that the silicon substrate 201 is exposed from the trench 210. A bottom surface of the trench 210 is an upper surface of the silicon substrate 201, and the side surfaces of the trench 210 are sequentially the side surface of the insulating layer 202, the side surface of the top silicon layer 203 and the side surface of the isolation dielectric layer 204 from bottom to top.

In some examples, the semiconductor structure 200 illustrated in FIG. 2a can be obtained through the following step S211 to step S213.

In step S211, a semiconductor substrate is provided. The semiconductor substrate includes a silicon substrate, an insulating layer, a top silicon layer and an isolation dielectric layer sequentially stacked from bottom to top.

In step S212, a trench pattern is defined on the isolation dielectric layer through a photolithography process.

In step S213, the semiconductor substrate is etched on the basis of the trench pattern to form a trench so that the silicon substrate at the position of the trench is exposed and the remaining semiconductor substrate forms a semiconductor structure. Thus, a semiconductor structure 200 illustrated in FIG. 2a is formed and a trench 210 is formed in the semiconductor structure 200.

The material of the insulating layer may be silicon dioxide. The isolation dielectric layer may include a silicon dioxide layer and a silicon nitride layer sequentially stacked from bottom to top.

In step S22, a first etch stop layer and an etch reaction layer are sequentially formed on a surface of the semiconductor structure according to the surface morphology of the semiconductor structure.

Figure 2B:
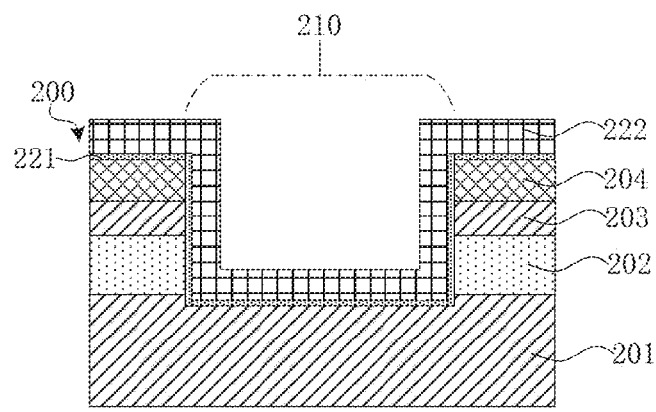

Referring to FIG. 2b, it illustrates a sectional structure of a device after step S22 on the basis of the structure illustrated in FIG. 2a.

A first etch stop layer 221 and an etch reaction layer 222 illustrated in FIG. 2b are formed on the surface of the semiconductor structure 200 illustrated in FIG. 2a. The first etch stop layer 221 and the etch reaction layer 222 cover the bottom surface and side surfaces of the trench 210 and the upper surface of the isolation dielectric layer 204.

The material of the first etch stop layer 221 may be silicon dioxide, and the thickness may be any thickness ranging from 20 Å to 100 Å. The material of the etch reaction layer 222 may be polysilicon or silicon nitride, and the thickness may be any thickness ranging from 50 Å to 200 Å.

In step S23, an etching operation is performed to the etch reaction layer. An etch stop surface of the etching operation is located in the first etch stop layer covering the bottom surface of the trench and in the etch reaction layer covering side surfaces of the trench. The remaining etch reaction layer on the side surface of the trench\ is enabled to form a sidewall structure.

Figure 2C:
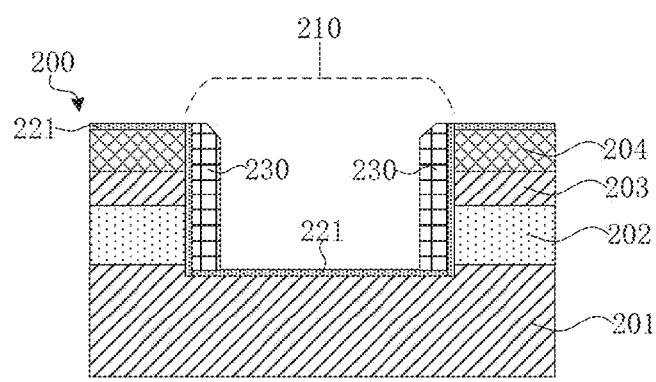
FIG. 2c illustrates a sectional structure of a device after step S23 on the basis of the structure illustrated in FIG. 2b.

Referring to FIG. 2c, it illustrates a sectional structure of a device after step S23 on the basis of the structure illustrated in FIG. 2b.

Due to the anisotropy of etching, the etch reaction layer covering a front surface of the semiconductor structure 200 is completely etched away, and the etch reaction layer covering the side surfaces of the semiconductor structure 200 is reserved.

The front surface of the semiconductor structure 200 includes the bottom surface of the trench 210 and the upper surface of the isolation dielectric layer 204, two sidewall structures 230 illustrated in FIG. 2c are formed by reserving part of the etch reaction layer on two side surfaces of the trench 210.

In addition to the sidewall structures 230, the etch reaction layer 222 on the bottom surface of the trench 210 is completely removed, and the etch reaction layer 222 on the upper surface of the isolation dielectric layer 204 is also completely removed, so that the first etch stop layer 221 on the bottom surface of the trench 210 is exposed other than the part under the sidewall structures 230, and the first etch stop layer 221 on the upper surface of the isolation dielectric layer 204 is also exposed.

In step S24, a second etch stop layer is filled in a space between the sidewall structures at the position of the trench.

Figure 2D:
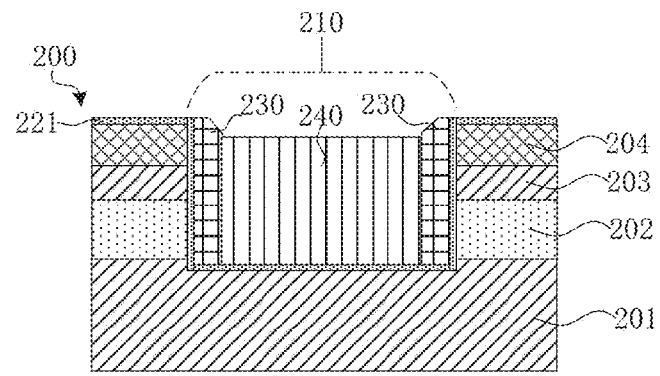
FIG. 2d illustrates a sectional structure of a device after step S24 on the basis of the structure illustrated in FIG. 2c.

Referring to FIG. 2d, it illustrates a sectional structure of a device after step S24 on the basis of the structure illustrated in FIG. 2c.

The formed second etch stop layer 240 is filled in a space between the two sidewall structures 230 in the trench 210. Upper ends of the two sidewall structures 230 are exposed from an upper surface of the second etch stop layer 240.

The second etch stop layer 240 may include any one or a combination of more of a photoresist layer, a Bottom Anti-Reflection Coating (BARC) and an Organic Dielectric Layer (ODL), and the thickness may be any thickness ranging from 100 Å to 1000 Å.

The device structure illustrated in FIG. 2d may be formed through the following step S241 to step S242 on the basis of the structure illustrated in FIG. 2c.

In step S241, protective dielectric is coated on the semiconductor structure 200 with the first etch stop layer 221 and the sidewall structures 230 illustrated in FIG. 2c. The protective dielectric is at least filled in the trench 210 with the sidewall structures 230.

In step S242, the protective dielectric formed after step S241 is etched so that upper ends of the sidewall structures 230 are exposed and the remaining protective dielectric is filled in the trench 210 between the sidewall structures 230 to form a second etch stop layer 240 illustrated in FIG. 2d.

In step S25, the sidewall structures and the first etch stop layer under the sidewall structures are etched to form a groove structure by using the second etch stop layer as a protective structure. The groove structure is depressed downwards from the bottom surface of the trench.

Figure 2E:
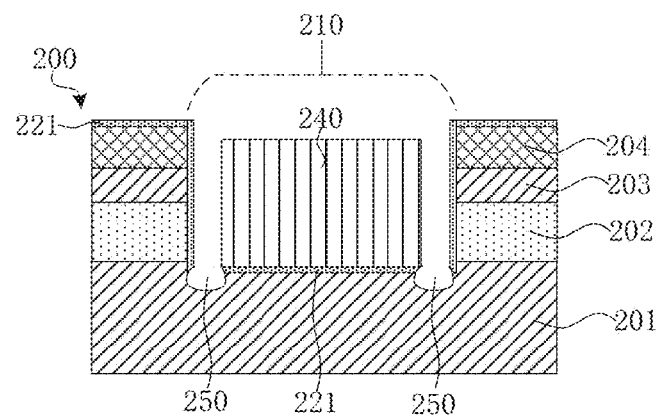
FIG. 2e illustrates a sectional structure of a device after step S25 on the basis of the structure illustrated in FIG. 2d.

Referring to FIG. 2e, it illustrates a sectional structure of a device after step S25 on the basis of the structure illustrated in FIG. 2d.

The second etch stop layer 240 illustrated in FIG. 2d can protect the position covered by it during step S25, so that the first etch stop layer 221 covered by the second etch stop layer 240 and the bottom surface of the trench 210 are not etched, while the first etch stop layer 221 and the bottom surface of the trench 210 not covered by the second etch stop layer 240 are etched, thus forming a groove structure 250 illustrated in FIG. 2e. The groove structure 250 is depressed downwards from the bottom surface of the trench 210.

The depth of the downward depression of the groove structure 250 from the bottom of the trench 210 can be set as required. The depth of the downward depression of the groove structure 250 from the bottom of the trench 210 may be set to any depth ranging from 50Å to 500 Å.

In step S26, the second etch stop layer and the remaining first etch stop layer are removed.

Figure 2F:
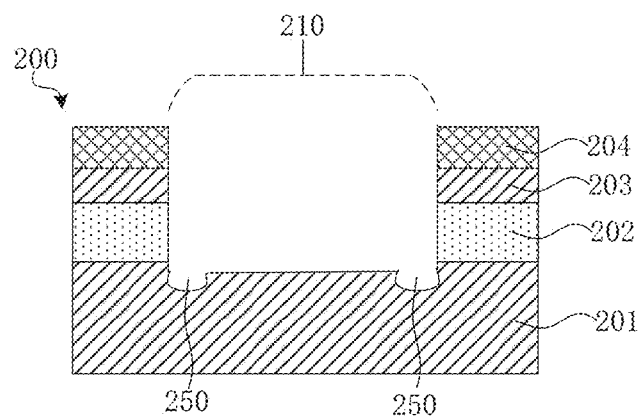
FIG. 2f illustrates a sectional structure of a device after step S26 on the basis of the structure illustrated in FIG. 2e.

Referring to FIG. 2f, it illustrates a sectional structure of a device after step S26 on the basis of the structure illustrated in FIG. 2e.

After the second etch stop layer 240 and the remaining first etch stop layer 221 illustrated in FIG. 2e are removed, a groove structure 250 is formed at the bottom position of the trench 210 close to each of the two sides of the trench 210.

In step S27, the silicon substrate at the positions of the trench and the groove structure is enabled to epitaxially grow upwards to form epitaxial silicon until the epitaxial silicon is in flush with an upper surface of the top silicon layer.

Figure 2G:
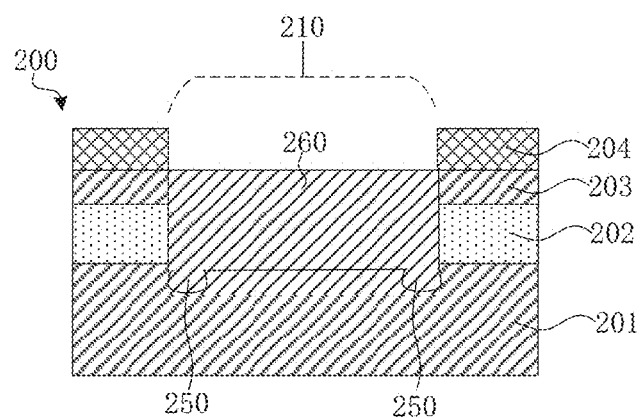
FIG. 2g illustrates a sectional structure of a device after step S27 on the basis of the structure illustrated in FIG. 2f.

Referring to FIG. 2g, it illustrates a sectional structure of a device after step S27 on the basis of the structure illustrated in FIG. 2f.

The groove structures 250 in FIG. 2e and FIG. 2f can counteract the overgrowth of silicon on the two sides of the trench 210 during the epitaxy process in step S27, so that the upper surface of the formed epitaxial silicon 260 is in flush with the upper surface of the top silicon 203.

Obviously, the above embodiments are only examples for clear description, instead of limitations to the embodiments. For those skilled in the art, other changes or variations in different forms may be made on the basis of the above description. It is unnecessary and impossible to enumerate all embodiments here. Obvious changes or variations derived thereby are still within the scope of protection of the present application.

What is claimed is:

1. A method for making silicon epitaxy of a fully depleted silicon-on-insulator (FDSOI) device, comprising the following steps performed sequentially:
   providing a semiconductor structure, the semiconductor structure comprising a silicon substrate, an insulation layer, a top silicon layer, and an isolation dielectric layer sequentially stacked from bottom to top, wherein a trench is formed in the semiconductor structure, and wherein the silicon substrate at a position of the trench is exposed;
   sequentially forming a first etch stop layer and an etch reaction layer on a surface of the semiconductor structure according to a surface morphology of the semiconductor structure;
   performing an etching operation to the etch reaction layer, an etch stop surface of the etching operation being located in the first etch stop layer covering a bottom surface of the trench and in the etch reaction layer covering side surfaces of the trench, wherein a remaining etch reaction layer on side surfaces of the trench forms two sidewall structures;
   filling a second etch stop layer in a space between the two sidewall structures at the position of the trench;
   etching the two sidewall structures and the first etch stop layer under the two sidewall structures to form two groove structures by using the second etch stop layer as a protective structure, the two groove structures being depressed downwards from the bottom surface of the trench;

removing the second etch stop layer and the remaining first etch stop layer; and enabling the silicon substrate at the positions of the trench and the groove structures to epitaxially grow upwards to form epitaxial silicon until the epitaxial silicon is flush with an upper surface of the top silicon layer.

2. The method for making silicon epitaxy of the FDSOI device according to claim 1, wherein the providing the semiconductor structure comprises:

providing a semiconductor substrate, the semiconductor substrate comprising the silicon substrate, the insulating layer, the top silicon layer, and the isolation dielectric layer sequentially stacked from bottom to top;

defining a trench pattern on the isolation dielectric layer through a photolithography process; and etching the semiconductor substrate on the basis of the trench pattern to form the trench so that the silicon substrate at the position of the trench is exposed and the remaining semiconductor substrate forms the semiconductor structure.

3. The method for making silicon epitaxy of the FDSOI device according to claim 1, wherein the sequentially forming the first etch stop layer and the etch reaction layer on the surface of the semiconductor structure according to the surface morphology of the semiconductor structure comprises:

sequentially forming a first etch stop layer with a thickness ranging from 20 Å to 100 Å and an etch reaction layer with a thickness ranging from 50 Å to 200 Å on a surface of the semiconductor structure according to the surface morphology of the semiconductor structure with the trench.

4. The method for making silicon epitaxy of the FDSOI device according to claim 1, wherein a material of the first etch stop layer is silicon dioxide.

5. The method for making silicon epitaxy of the FDSOI device according to claim 1, wherein a material of the etch reaction layer is polysilicon or silicon nitride.

6. The method for making silicon epitaxy of the FDSOI device according to claim 1, wherein the filling the second etch stop layer in the space between the two sidewall structures at the position of the trench comprises:

coating protective dielectric on the semiconductor structure with the first etch stop layer and the two sidewall structures, the protective dielectric being at least filled in the trench with the two sidewall structures; and etching the protective dielectric so that upper ends of the two sidewall structures are exposed and the remaining protective dielectric is filled in the trench between the two sidewall structures to form the second etch stop layer.

7. The method for making silicon epitaxy of the FDSOI device according to claim 6, wherein a material of the protective dielectric is photoresist.

8. The method for making silicon epitaxy of the FDSOI device according to claim 6, wherein in the etching the protective dielectric so that the upper ends of the two sidewall structures are exposed and the remaining protective dielectric is filled in the trench between the two sidewall structures to form the second etch stop layer, a thickness of the formed second etch stop layer ranges from 100 Å to 1000 Å.

9. The method for making silicon epitaxy of the FDSOI device according to claim 1, wherein in the etching the two sidewall structures and the first etch stop layer under the two sidewall structures to form the two groove structures by using the second etch stop layer as the protective structure, the two groove structures being depressed downwards from the bottom surface of the trench, a depth of downward depression of the two groove structures from the bottom surface of the trench ranges from 50 Å to 500 Å.

* * * * *